(12) United States Patent
Miller et al.

(10) Patent No.: US 7,808,286 B1
(45) Date of Patent: Oct. 5, 2010

(54) CIRCUITRY IN A DRIVER CIRCUIT

(75) Inventors: Ira G. Miller, Tempe, AZ (US); John M. Pigott, Phoenix, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/429,491

(22) Filed: Apr. 24, 2009

(51) Int. Cl.
*H03K 3/00* (2006.01)

(52) U.S. Cl. ........................ 327/112; 327/108

(58) Field of Classification Search ........................ None
See application file for complete search history.

(56) References Cited

U.S. PATENT DOCUMENTS

| | | | |
|---|---|---|---|
| 5,214,322 | A | 5/1993 | Neidorff et al. |
| 6,429,700 | B1* | 8/2002 | Yang .................... 327/108 |
| 7,301,376 | B2* | 11/2007 | Capodivacca et al. ....... 327/112 |
| 7,408,388 | B2* | 8/2008 | Nagasawa et al. ........... 327/110 |
| 2007/0262797 | A1* | 11/2007 | Okamoto et al. ............ 327/112 |

OTHER PUBLICATIONS http://media.freescale.com/phoenix.zhtml?c=196520&p=irol-newsArticle&ID=1256442&highlight=solar "Freescale demonstrates breakthrough in power conversion technology for single-cell solar chargers"; Freescale News Release; 2 pp; Feb. 16, 2009, Freescale Semiconductor, Inc., Washington, DC. Printed copy being submitted.
http://www.freescale.com/webapp/sps/site/overview.jsp?code=PVENERGYHOME&fsrch=1 Photovoltaic Energy; 2pp; downloaded Apr. 2, 1999, Freescale Semiconductor, Inc. Printed copy being submitted.

* cited by examiner

*Primary Examiner*—Tuan Lam
*Assistant Examiner*—Hiep Nguyen
(74) *Attorney, Agent, or Firm*—Robert L. King; Joanna G. Chiu (57) ABSTRACT

A driver circuit includes a first and a second voltage rail, a first pre-driver circuit, a power transistor, comparison circuitry which indicates when a voltage level of the first voltage rails is above or below a reference voltage level, a level shift circuit coupled between the first voltage rail and the second voltage rail which provides a level shifted output, a tapered buffer circuit coupled to the first voltage rail and to a first circuit node, wherein the tapered buffer circuit receives the level shifted output and provides a buffered output to a control electrode of the first pre-driver transistor, and a rail voltage adjusting circuit coupled between the first circuit node and the second voltage rail, which, in response to the comparison circuitry indicating that the voltage level of the first voltage rail is above the reference voltage level, adjusts a voltage level of the second voltage rail.

20 Claims, 3 Drawing Sheets

FIG. 3

CIRCUITRY IN A DRIVER CIRCUIT

BACKGROUND

1. Field

This disclosure relates generally to semiconductors, and more specifically, to the control of a supply voltage used in MOS driver circuits.

2. Related Art

Integrated circuits are constantly being advanced by becoming smaller in area required to be implemented and using less power. Power is typically optimized with devices capable of operating at low voltage and having low transistor threshold voltages. A transistor's threshold voltage is the amount of voltage required to make the transistor become conductive. A transistor's control electrode or gate is electrically insulated from a bulk or substrate material by a gate oxide material. As transistors are formed with smaller geometries, the thickness of the gate oxide material has decreased significantly. As a result, the gate oxide layer of transistors has become vulnerable to being damaged by supply voltages that previously did not cause any damage. This voltage limitation creates a maximum value that a gate-to-source voltage, $V_{GS}$, of a transistor may have. This maximum value is typically referred to as a transistor's breakdown voltage. The maximum voltage that the gate can sustain is often limited due to the thinner gate oxide thickness. Complex systems with varied circuitry operating at different voltage values can therefore provide voltages that exceed the breakdown voltage of the gate of some transistors. Semiconductor processing techniques to achieve higher gate-to-source voltage values typically increase the cost and complexity of a semiconductor.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
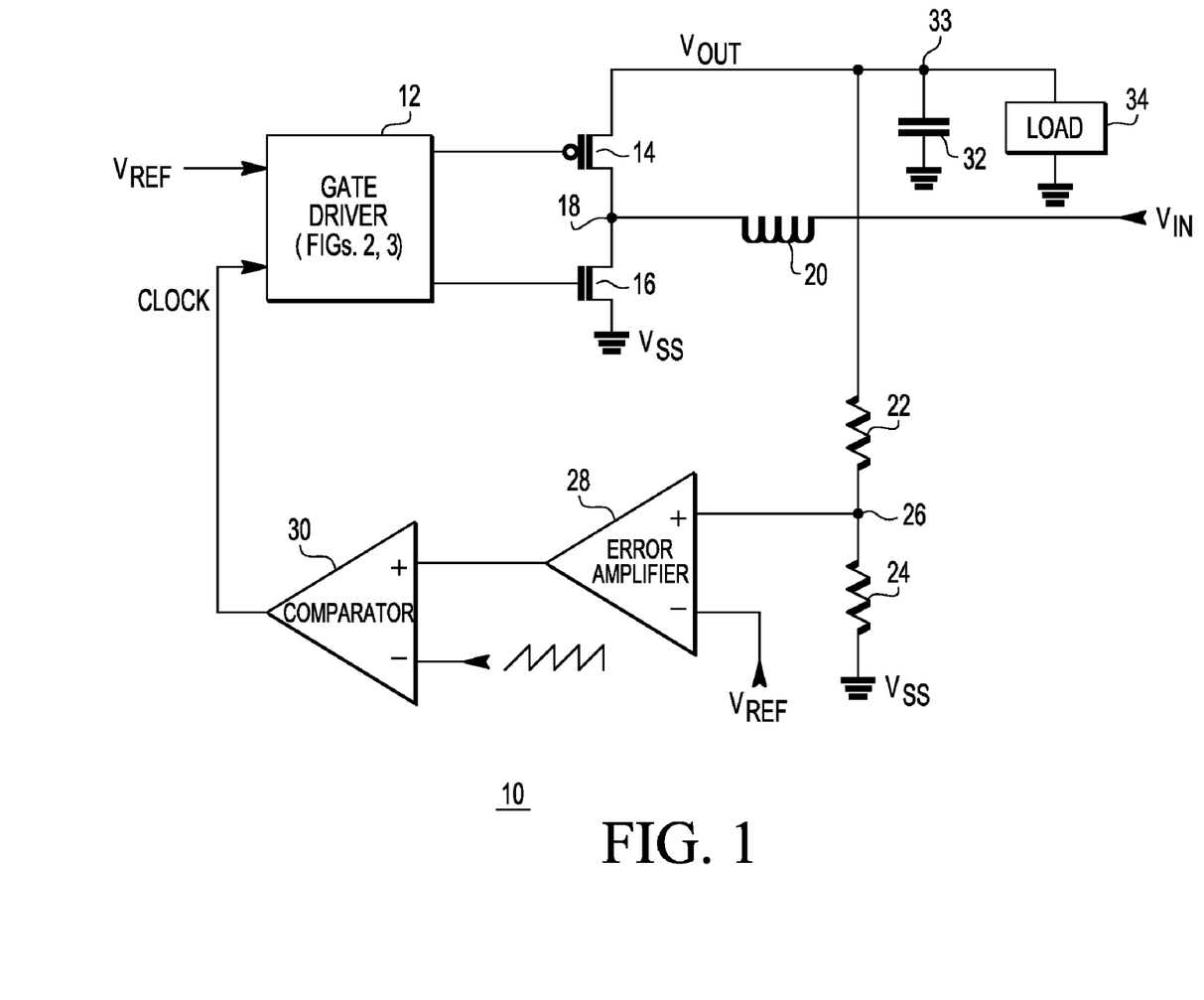
FIG. 1 illustrates in partial schematic form an exemplary D.C.-to-D.C converter using a power MOS driver circuit in accordance with one form of the present invention.

Illustrated in FIG. 1 is a DC to DC converter 10 which converts a source of direct current from one voltage level to another voltage level. DC to DC converters are commonly used in portable electronic devices such as cellular phones and laptop computers which are powered from batteries. In such devices, various sub-module circuits are powered at differing voltages other than the voltage level of the battery. A power MOS driver circuit or a gate driver 12 that will be detailed in FIG. 2 has a first input for receiving a voltage reference, $V_{REF}$, that will be further explained in connection with FIG. 2. A first output is connected to a gate of a P-channel power transistor 14. Power transistor 14 has a source connected to an output node 33 for providing an output voltage labeled $V_{out}$. A drain of power transistor 14 is connected to a drain of an N-channel power transistor 16 at a node 18. A second output of the gate driver 12 is connected to a gate of the power transistor 16. A source of power transistor 16 is connected to a reference voltage terminal for receiving a supply voltage labeled $V_{SS}$. In one form the $V_{SS}$ potential is an earth ground potential. A first terminal of an inductor 20 is connected to node 18 and a second terminal of inductor 20 is coupled to receive an input voltage $V_{IN}$. A first terminal of a resistor 22 is connected to an output node 33. A second terminal of resistor 22 is connected to a first terminal of a resistor 24 at a node 26 and to a positive or non-inverting input of an error amplifier 28. A second terminal of resistor 24 is connected to the reference voltage terminal for receiving supply voltage $V_{SS}$. A negative or inverting input of error amplifier 28 is connected to a second reference voltage which is also labeled $V_{REF}$. It should be noted that the value of the reference voltage connected to error amplifier 28 is not necessarily the same value of the reference voltage connected to gate driver 12. The reference voltage value connected to error amplifier 28 is a value selected for the regulated output voltage. The reference voltage value connected to gate driver 12 is a voltage that determines a threshold value when transistor gate oxide protection begins. Thus the two reference voltage values may differ from each other. An output of error amplifier 28 is connected to a positive input of a comparator 30 that is functioning as an error amplifier. A negative input of comparator 30 receives an alternating reference voltage signal having at least one voltage transition that does not occur near instantaneously (i.e. not having a vertical edge transition). An output of comparator 30 is connected to a second input of the gate driver 12. As mentioned above the source of transistor 14 provides the output voltage $V_{OUT}$ at node 33. Connected to node 33 is a first terminal of a capacitor 32. A second terminal of capacitor 32 is connected to the reference voltage terminal $V_{SS}$. A load 34 has a first terminal connected to node 33 and a second terminal connected to the voltage terminal for receiving supply voltage $V_{SS}$. The capacitance of load 34 is represented by capacitor 32.

In operation, the input signal $V_{IN}$ is received and has a first voltage level. The gate driver 12 and power transistors 14 and 16 function to provide the output voltage $V_{OUT}$ which is level shifted upward by an amount that might damage the gate oxides of transistors within the gate driver 12. As one example, the input signal voltage may be a relatively small voltage that is generated by a source such as a solar cell. The output voltage $V_{OUT}$ may be a voltage that is sufficient to charge a battery of a wireless electronic device such as a cell phone or a laptop computer. Thus, by way of example, the input voltage may be a voltage approximating a value of 0.8 volt and the output voltage may vary between 2.5 and 5.0 volts. While other voltage values may be implemented depending upon the type of circuit process used and the circuit application, the method and structure described herein equally applies.

Gate driver 12 makes power transistor 16 conductive so that the received input voltage charges the inductor 20. After current has accumulated in inductor 20, power transistor 16 is made nonconductive and power transistor 14 is made conductive in response to the varying clock signal applied to gate driver 12. Charge is transferred from inductor 20 through power transistor 14 onto the load 34 and its associated capacitance of capacitor 32. Additionally some of the transferred charge is conducted by resistors 22 and 26 which function as a voltage divider. A voltage at node 26 is input to the error amplifier 28 and amplified relative to the $V_{REF}$ reference voltage. An output of error amplifier 28 is used by comparator 30 that performs a compare function between the amplified voltage and the alternating reference voltage. Comparator 30 provides a pulse output that is a clock signal having a pulse width that is modulated or varied depending upon the value of amplified voltage that is provided by error amplifier 28. Gate driver 12 uses the clock signal and a reference voltage to provide drive signal outputs to the gates of power transistors 14 and 16. When gate driver 12 is implemented with small dimensioned transistors, the supply voltage that is required to provide sufficient drive signals to the power transistors 14 and 16 may be sufficient to cause damage to the transistor gate oxides of transistors within gate driver 12. Therefore, gate driver 12 is designed to avoid excessive supply voltages from damaging the transistors within gate driver 12 as will be explained in connection with FIG. 2.

Figure 2:
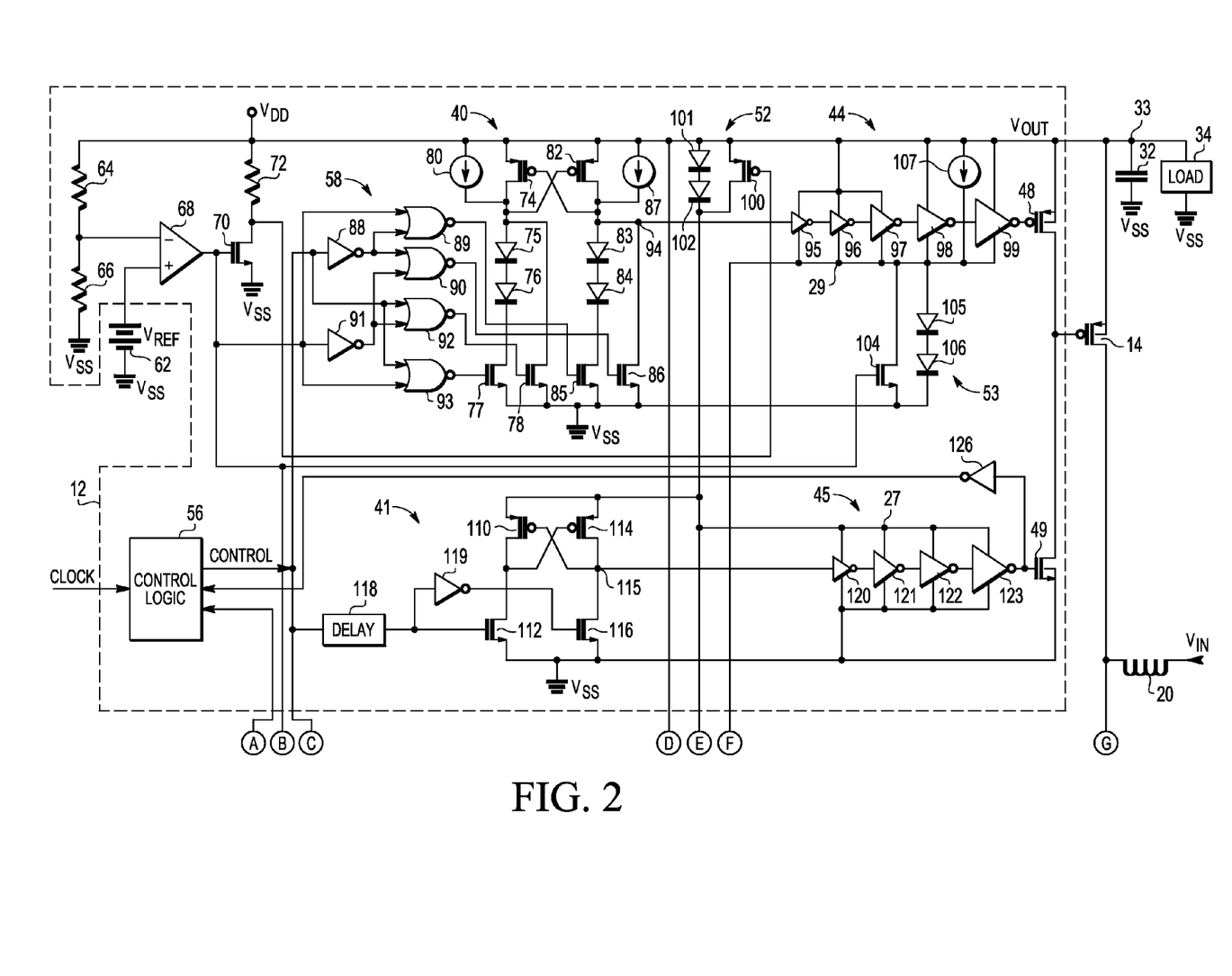
FIGS. 2 and 3 collectively illustrate in schematic form a power MOS driver circuit in accordance with one form of the present invention.
Figure 3:
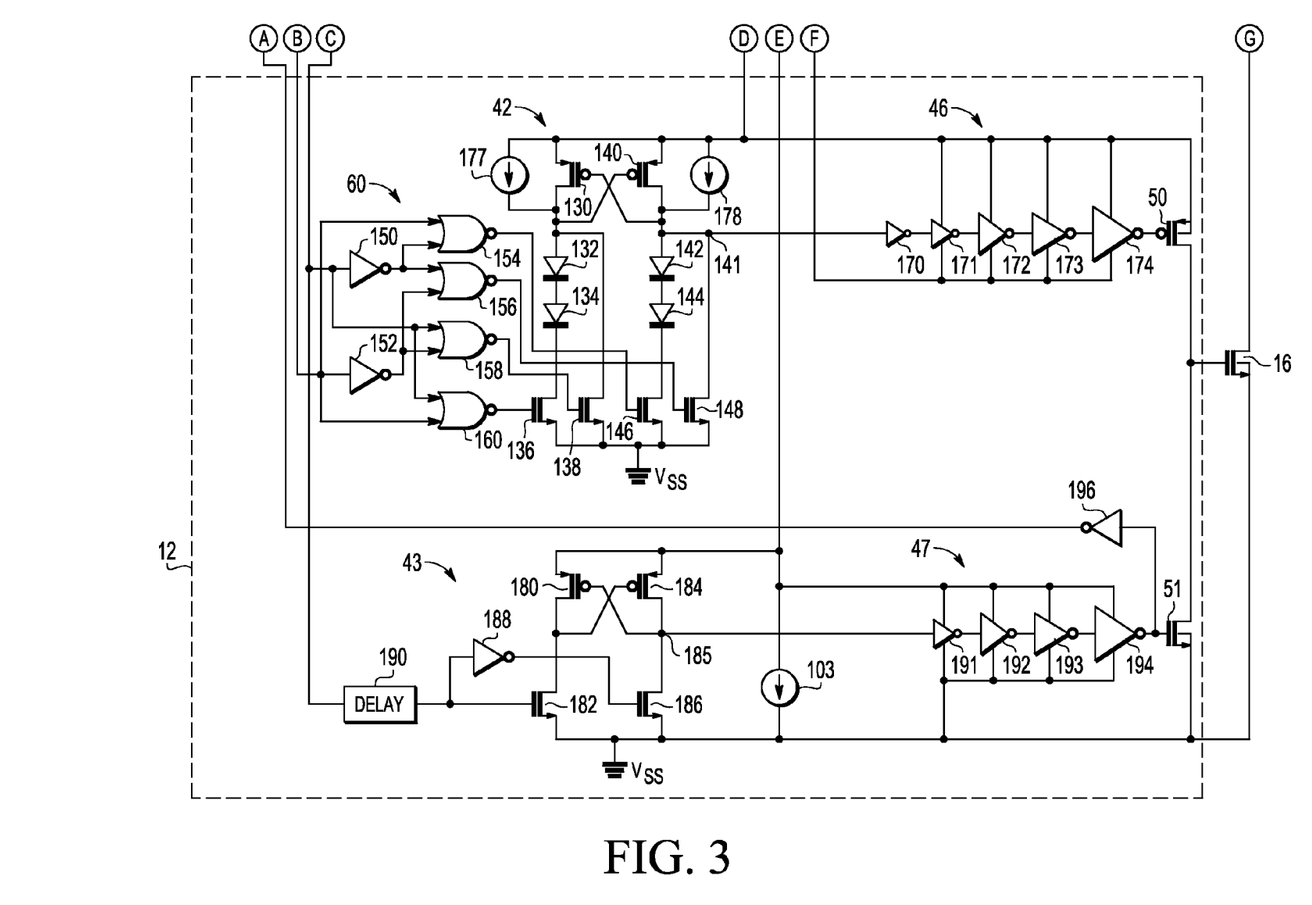

Illustrated in FIGS. 2 and 3 is an example form of a detailed composite implementation of the gate driver 12 indicated by a dashed line being connected to a portion of the additional circuitry of FIG. 1. FIGS. 2 and 3 may be connected to each other using the lettered connections A, B, C, D, E, F and G common to each figure when FIG. 2 is placed adjacent to FIG. 3. For convenience of illustration, elements which are common to FIG. 1 and the composite FIGS. 2 and 3 are given the same reference number. The gate driver 12 has separate level shift circuits 40, 41, 42 and 43. An output of each of level shift circuits 40, 41, 42 and 43 is respectively coupled to a tapered buffer circuit 44, 45, 46 and 47. An output of each of tapered buffer circuits 44, 45, 46 and 47 is respectively coupled to a control gate of pre-driver transistors 48, 49, 50 and 51. Pre-driver transistors 48 and 49 drive power transistor 14, and pre-driver transistors 50 and 51 drive power transistor 16. A rail voltage adjusting circuit 52 is connected to a first or $V_{DD}$ voltage rail which provides the driver circuit output at output node 33. A rail voltage adjusting circuit 53 is connected between a first circuit node 29 and a second or $V_{SS}$ voltage rail. In the illustrated form the $V_{DD}$ voltage is more positive than the $V_{SS}$ voltage. Control logic 56 controls the operation of gate driver 12. Control logic 56 has an input for receiving the clock signal from comparator 30 of FIG. 1. An output of control logic 56 provides a Control signal and is connected to both an enable circuit 58 and an enable circuit 60. A reference voltage source 62 has a negative terminal connected to the $V_{SS}$ voltage rail. A positive terminal of the reference voltage source 62 is connected to a positive input of comparison circuitry 68. Resistors 64 and 66 form a voltage divider. A first terminal of resistor 64 is connected to the $V_{DD}$ voltage rail, and a second terminal of resistor 64 is connected to a negative input of comparison circuitry 68 and to a first terminal of resistor 66. A second terminal of resistor 66 is connected to the $V_{SS}$ voltage rail. An output of comparison circuitry 68 is connected to a gate or control electrode of an N-channel transistor 70. A first terminal of a resistor 72 is connected to the $V_{DD}$ voltage rail, and a second terminal of resistor 72 is connected to a drain of transistor 70. A source of transistor 70 is connected to the $V_{SS}$ voltage rail.

The level shift circuit 40 has a source of a P-channel transistor 74 connected to the $V_{DD}$ voltage rail at output node 33. A drain of transistor 74 is connected to a cathode of a diode 75. An anode of diode 75 is connected to a cathode of a diode 76. An anode of diode 76 is connected to a drain of an N-channel transistor 77. A source of transistor 77 is connected to the $V_{SS}$ voltage rail. Diodes 75 and 76 and transistor 77 form a leg portion of the level shift circuit 40. An N-channel transistor 78 has a drain connected to the cathode of diode 75. A source of transistor 78 is connected to the $V_{SS}$ voltage rail. Thus transistor 78 forms an alternate parallel path of the leg portion. A current source 80 has a first terminal connected to the $V_{DD}$ voltage rail and a second terminal connected to the drain of transistor 74. A P-channel transistor 82 has a source connected to the $V_{DD}$ voltage rail, a gate cross-coupled or connected to the drain of transistor 74, and a drain connected to a cathode of a diode 83 and cross-coupled or connected to a gate of transistor 74 at a node 94 of level shift circuit 40 which is an output of level shift circuit 40. A current source 87 has a first terminal connected to the $V_{DD}$ voltage rail at output node 33 and a second terminal connected to the drain of transistor 82 at node 94. An anode of diode 83 is connected to a cathode of a diode 84. An anode of diode 84 is connected to a source of a transistor 85. A source of transistor 85 is connected to the $V_{SS}$ voltage rail. Diodes 83 and 84 and transistor 85 form a second leg portion of level shift circuit 40. A drain of a transistor 86 is connected to the node 94, and a source of transistor 86 is connected to the $V_{SS}$ voltage rail. Transistor 86 provides an alternate parallel path of the second leg portion.

The enable circuit 58 that enables level shift circuit 40 has an inverter 88 having an input connected to the output of the control logic 56 for receiving the Control signal. An output of inverter 88 is connected to a first input of a NOR gate 89 and a first input of a NOR gate 90. A second input of NOR gate 89 is connected to the output of comparison circuitry 68. An input of an inverter 91 is also connected to the output of comparison circuitry 68. An output of inverter 91 is connected to a second input of NOR gate 90. A NOR gate 92 has a first input connected to the output of control logic 56 for receiving the Control signal and has a second input connected to the output of inverter 91. A NOR gate 93 has a first input connected to the output of control logic 56 for receiving the Control signal and has a second input connected to the output of comparison circuitry 68. An output of NOR gate 89 is connected to the gate of transistor 85. An output of NOR gate 90 is connected to the gate of transistor 86. An output of NOR gate 92 is connected to the gate of transistor 78. An output of NOR gate 93 is connected to the gate of transistor 77.

The output of the level shift circuit 40 is connected to the input of the tapered buffer circuit 44. More specifically, the node 94 is connected to an input of an inverter 95. An output of inverter 95 is connected to an input of an inverter 96. An output of inverter 96 is connected to an input of an inverter 97. An output of inverter 97 is connected to an input of an inverter 98. An output of inverter 98 is connected to an input of an inverter 99. An output of inverter 99 is connected to a gate of pre-driver transistor 48. Each of inverters 95-99 has a first power supply voltage terminal connected to the $V_{DD}$ voltage rail at output node 33. Each of inverters 95-99 has a second power supply voltage terminal connected together and to the first circuit node 29. Inverters 95-99 form tapered buffer circuit 44 wherein each inverter from inverter 95 through inverter 99 is sequentially sized larger (i.e. from smallest to largest). The tapered sizing of the transistor dimensions of the inverters 95-99 sequentially increases the drive strength of the digital signal propagating through inverters 95-99. The most critical transistor dimension that is sequentially sized is the control electrode or gate dimension as the channel width in part determines current conducting capacity of the transistor.

The rail voltage adjusting circuit 53 has an N-channel transistor 104 and diodes 105 and 106. The transistor 104 has a drain connected to the first circuit node 29, a gate connected to the output of comparison circuitry 68 and a source connected to the $V_{SS}$ voltage rail. A cathode of a diode 105 is connected to the first circuit node 29. An anode of diode 105 is connected to a cathode of a diode 106. An anode of diode 106 is connected to the $V_{SS}$ voltage rail. Pre-driver transistor 48 has a source connected to the output node 33 and a drain connected to both a gate of power transistor 14 and a drain of pre-driver transistor 49. External to gate driver 12, power transistor 14 has a source connected to output node 33 and a drain connected to a first terminal of inductor 20 and a drain of power transistor 16. A source of power transistor 16 is connected to the $V_{SS}$ voltage rail. A second terminal of inductor 20 receives the input voltage $V_{IN}$. A first terminal of capacitor 32 is connected to output node 33 and a second terminal of capacitor 32 is connected to the $V_{SS}$ voltage rail. A load 34 has a first terminal connected to the output node 33 and a second terminal connected to the $V_{SS}$ voltage terminal. A current source 107 has a first terminal connected to the $V_{DD}$ voltage rail at output node 33 and a second terminal connected to node 29.

Level shift circuit 41 is formed of P-channel transistors 110 and 114 and N-channel transistors 112 and 116. An input of a delay circuit 118 is connected to the output of the control logic 56 for receiving the Control signal. An output of delay circuit 118 is connected to an input of an inverter 119. Transistor 110 has a source coupled to the $V_{DD}$ voltage rail by the rail voltage adjusting circuit 52. A cathode of a diode 101 is connected to the $V_{DD}$ voltage rail at output node 33. An anode of diode 101 is connected to a cathode of a diode 102. An anode of diode 102 is connected to the source of transistor 110. The rail voltage adjusting circuit 52 also has a P-channel transistor having a source connected to the $V_{DD}$ voltage rail at output node 33. A gate of transistor 100 is connected to the second terminal of resistor 72. A drain of transistor 100 is connected to the anode of diode 102. Transistor 110 has a drain connected to a drain of transistor 112. A source of transistor 112 is connected to the $V_{SS}$ voltage rail. Transistor 114 has a source connected to the anode of diode 102 and has a drain connected to a drain of transistor 116 at a node 115. A source of transistor 116 is connected to the $V_{SS}$ voltage rail. A gate of transistor 110 is connected to the drain of transistor 114 at node 115 which is the output of level shift circuit 41. A gate of transistor 114 is connected to the drain of transistor 110. The output of delay circuit 118 is connected to the gate of transistor 112. The output of inverter 119 is connected to the gate of transistor 116.

Tapered buffer circuit 45 has inverters 120, 121, 122 and 123. An input of inverter 120 is connected to node 115. An output of inverter 120 is connected to an input of inverter 121. An output of inverter 121 is connected to an input of inverter 122. An output of inverter 122 is connected to an input of inverter 123. An output of inverter 123 is connected to a gate of pre-driver transistor 49 and to an input of an inverter 126. An output of inverter 126 is connected to a first feedback input of the control logic 56. A source of transistor 49 is connected to the $V_{SS}$ voltage rail. Each of inverters 120-123 has a first power supply voltage terminal connected together at a second circuit node 27 and to the anode of diode 102 and drain of transistor 100. Each of inverters 120-123 has a second power supply terminal connected together to the $V_{SS}$ voltage rail. Inverters 120-123 form tapered buffer circuit 45 wherein each inverter from inverter 120 through inverter 123 is sequentially sized larger (i.e. from smallest to largest). The tapered sizing of the transistor dimensions of the inverters 120-123 sequentially increases the drive strength of the digital signal propagating through inverters 120-123. An output of inverter 123 is connected to an input of an inverter 126. An output of inverter 126 is connected to a first feedback input of the control logic 56.

The level shift circuit 42 has a source of a P-channel transistor 130 connected to the $V_{DD}$ voltage rail at output node 33. A drain of transistor 130 is connected to a cathode of a diode 132. An anode of diode 132 is connected to a cathode of a diode 134. An anode of diode 134 is connected to a drain of an N-channel transistor 136. A source of transistor 136 is connected to the $V_{SS}$ voltage rail. An N-channel transistor 138 has a drain connected to the cathode of diode 132. A source of transistor 138 is connected to the $V_{SS}$ voltage rail. A current source 177 has a first terminal connected to the $V_{DD}$ voltage rail and a second terminal connected to the drain of transistor 130. A P-channel transistor 140 has a source connected to the $V_{DD}$ voltage rail, a gate cross-coupled or connected to the drain of transistor 130, and a source connected to a cathode of a diode 142 and cross-coupled or connected to the gate of transistor 130 at an output node 141 of level shift circuit 42. A gate of transistor 130 is also connected to output node 141. A first terminal of a current source 178 is connected to the $V_{DD}$ voltage rail and a second terminal of current source 178 is connected to output node 141. An anode of diode 142 is connected to a cathode of a diode 144. An anode of diode 144 is connected to a source of a transistor 146. A source of transistor 146 is connected to the $V_{SS}$ voltage rail. A drain of a transistor 148 is connected to the output node 141, and a source of transistor 148 is connected to the $V_{SS}$ voltage rail.

The enable circuit 60 that enables level shift circuit 42 has an inverter 150 having an input connected to the output of the control logic 56 for receiving the Control signal. An output of inverter 150 is connected to a first input of a NOR gate 154 and a first input of a NOR gate 156. A second input of NOR gate 154 is connected to the output of comparison circuitry 68. An input of an inverter 152 is also connected to the output of comparison circuitry 68. An output of inverter 152 is connected to a second input of NOR gate 156. A NOR gate 158 has a first input connected to the output of control logic 56 for receiving the Control signal and has a second input connected to the output of inverter 152. A NOR gate 160 has a first input connected to the output of control logic 56 for receiving the Control signal and has a second input connected to the output of comparison circuitry 68. An output of NOR gate 154 is connected to the gate of transistor 146. An output of NOR gate 156 is connected to the gate of transistor 148. An output of NOR gate 158 is connected to the gate of transistor 138. An output of NOR gate 160 is connected to the gate of transistor 136.

The output of the level shift circuit 42 is connected to the input of the tapered buffer circuit 46. More specifically, the output node 141 is connected to an input of an inverter 170. An output of inverter 170 is connected to an input of an inverter 171. An output of inverter 171 is connected to an input of an inverter 172. An output of inverter 172 is connected to an input of an inverter 173. An output of inverter 173 is connected to an input of an inverter 174. An output of inverter 174 is connected to a gate of pre-driver transistor 50. Each of inverters 170-174 has a first power supply voltage terminal connected to the $V_{DD}$ voltage rail at output node 33. A source of pre-driver transistor 50 is also connected to the $V_{DD}$ voltage rail at output node 33. Each of inverters 170-174 has a second power supply voltage terminal connected together and to the first circuit node 29. Inverters 170-174 form tapered buffer circuit 46 wherein each inverter from inverter 170 through inverter 174 is sequentially sized larger (i.e. from smallest to largest). The tapered sizing of the transistor dimensions of the inverters 170-174 sequentially increases the drive strength of the digital signal propagating through inverters 170-174.

Level shift circuit 43 is formed of P-channel transistors 180 and 184 and N-channel transistors 182 and 186. An input of a delay circuit 190 is connected to the output of the control logic 56. An output of delay circuit 190 is connected to an input of an inverter 188. Transistor 180 has a source connected to the anode of diode 102 at node 27 and has a drain connected to a drain of transistor 182. A source of transistor 182 is connected to the $V_{SS}$ voltage rail. Transistor 184 has a source connected to the source of transistor 180 at node 27 and has a drain connected to a drain of transistor 186 at a node 185. A source of transistor 186 is connected to the $V_{SS}$ voltage rail. A gate of transistor 180 is connected to the drain of transistor 184 at node 185 which is the output of level shift circuit 43. A gate of transistor 184 is connected to the drain of transistor 180. The output of delay circuit 190 is also connected to the gate of transistor 182. The output of inverter 188 is connected to the gate of transistor 186. A first terminal of a current sink 103 is connected to the anode of diode 102 at node 27 and a second terminal of current sink 103 is connected to the $V_{SS}$ voltage rail.

Tapered buffer circuit 47 has inverters 191, 192, 193 and 194. An input of inverter 191 is connected to node 185. An output of inverter 191 is connected to an input of inverter 192. An output of inverter 192 is connected to an input of inverter 193. An output of inverter 193 is connected to an input of inverter 194. An output of inverter 194 is connected to a gate of pre-driver transistor 51 and to an input of an inverter 196. An output of inverter 196 is connected to a second feedback input of control logic 56. Each of inverters 191-194 has a first power supply terminal connected together at the second circuit node 27 and to the anode of diode 102 and drain of transistor 100. Each of inverters 191-194 has a second power supply terminal connected together to the $V_{SS}$ voltage rail. Inverters 191-194 form tapered buffer circuit 47 wherein each inverter from inverter 191 through inverter 194 is sequentially sized larger (i.e. from smallest to largest). The tapered sizing of the transistor dimensions of the inverters 191-194 sequentially increases the drive strength of the digital signal propagating through inverters 191-194. A drain of pre-driver transistor 50 is connected to a gate of power transistor 16 and to a drain of pre-driver transistor 51. A source of pre-driver transistor 51 is connected to the $V_{SS}$ voltage rail.

In operation, circuitry within the gate driver 12 functions to permit the use of MOS transistors with a voltage applied to the $V_{DD}$ voltage rail that is in excess of a safe operating range of the MOS transistors. Node 33 provides the output, $V_{OUT}$, of gate driver 12 and will vary as a function of the input voltage, $V_{IN}$, the switching of transistors 14 and 16, capacitor 32 and load 34. The output signal $V_{OUT}$ is used to power the $V_{DD}$ supply rail. A separate $V_{DD}$ power supply voltage is not connected to the $V_{DD}$ supply rail. FIG. 2 symbolically represents that the node 33 is a $V_{DD}$ voltage rail. As a result of the output voltage establishing $V_{DD}$, the $V_{DD}$ power supply voltage varies during circuit operation. Depending upon the circuit application, such as in a D.C.-to-D.C. converter, the $V_{DD}$ voltage may exceed a safe operating value and cause damage to the gate oxide layer of one or more of the MOS transistors. Additionally, the circuitry within the gate driver 12 must be capable of permitting circuit operation with low $V_{DD}$ voltage rail voltages, such as around 2.0 volts. As will be described herein, the rail voltage adjusting circuits 52 and 53 use a diode configuration to limit transistor gate voltage swings. When low voltages exist on the $V_{DD}$ voltage rail, the diode configuration is bypassed to permit the lower voltage to properly bias the MOS transistors. Transistor sizing and feedback paths are used to minimize the time when both P-channel and N-channel series-connected transistors in the tapered buffer circuits 44-47 are conductive which is a condition referred to as shoot through referring to when current conducts from one supply voltage rail to the other.

The comparison circuitry 68 uses a predetermined reference voltage as a voltage above which it is generally not desired to apply to the gates of any of the transistors. In one application the reference voltage may be approximately four volts, but this voltage is process dependent. When the voltage at the first input of comparison circuitry 68 is no greater than four volts, transistor 70 is conductive. A logic high output of comparison circuitry 68 makes transistor 104 conductive and a full $V_{DD}$ to $V_{SS}$ voltage is used to drive the tapered buffer circuit 44. Transistor 48 is conductive during this voltage state as the output of level shift circuit 40 at node 94 is a logic high. The output of level shift circuit 40 will assume a same logic value as the logic value presented at the input of inverter 91. The control logic 56 is clocked by the oscillating clock signal, Clock, which is presented as an oscillating Control signal to the input of inverter 88. The oscillating Control signal causes the output of level shift circuit 40 to oscillate between logic high and logic low levels. When the output of the comparison circuitry 68 provides a logic high output indicating that the voltage at the first input thereof is not greater than the reference voltage, transistor 70 is made conductive which places a low logic value on the gate of transistor 100 thereby making transistor 100 conductive to bypass diodes 101 and 102. Similarly, a high logic value is placed on the control electrode or gate of transistor 104 which bypasses diodes 105 and 106. The low voltage rail for the tapered buffer circuit 44 is at ground or $V_{SS}$ potential which is the lowest voltage potential it may have. Assume that the Control signal has a logic low value initially so that a logic low is at the input of inverter 88 and a logic high is at the input of inverter 91. With these circuit conditions, transistors 77, 85 and 86 are nonconductive and transistor 78 is conductive. Transistor 85 bypasses diodes 75 and 76 in a leg portion of level shift circuit 40. When the Control signal transitions to a logic high value in response to the Clock signal input, transistors 77, 78 and 85 are nonconductive and transistor 86 is conductive. Thus, the clocking action of the Control signal from control logic 56 causes current conduction in different leg portions of level shift circuit 40 during two successive clock phases. Transistors 74 and 82 are cross-coupled transistors which alternately conduct. When transistor 78 is initially conductive, the $V_{SS}$ potential is coupled to the gate of transistor 82 which makes it conductive and places the voltage of the $V_{DD}$ voltage rail on the node 94. That voltage makes transistor 74 nonconductive. Thus level shift circuit 40 has level shifted the voltage received at the input of inverter 91 to a voltage having the value of the $V_{DD}$ supply voltage rail. When the Control signal transitions and makes transistor 86 conductive, the $V_{SS}$ potential is applied to the gate of transistor 74 which makes transistor 74 conductive. When transistor 74 conducts, the gate of transistor 82 is biased to the voltage of the $V_{DD}$ voltage rail and becomes nonconductive. Thus the output of the level shift circuit 40 at node 94 is pulled to the $V_{SS}$ potential by transistor 86 conducting. The tapered buffer circuit 44 receives the level shifted output at node 94 and provides a buffered output to the gate or control electrode of transistor 48 which biases transistor 48 either on or off in alternating fashion.

Now assume that the coupling of inductor 20 to the $V_{DD}$ voltage rail by transistor 14 and the charging of capacitor 32 causes the $V_{DD}$ voltage rail to increase above the reference voltage of the reference voltage source 62. The $V_{REF}$ voltage is a voltage determined to be a safe voltage to be applied to the gates or control electrodes of the transistors within the gate driver 12 without damaging gate oxide layers. Under this circuit condition the output of comparison circuitry 68 is a logic zero which makes transistor 70 nonconductive. The voltage at the drain of transistor 70 rises to the voltage of the $V_{DD}$ supply voltage rail minus the voltage drop across resistor 72. This voltage is adequate to turn off transistor 100 wherein diodes 101 and 102 are no longer bypassed. Similarly, transistor 104 is made nonconductive and diodes 105 and 106 are no longer bypassed. Current source 107 functions to provide a constant current to node 29 and through diodes 105 and 106 to generate a substantially constant voltage drop across the diodes. With a logic zero value at the input of inverter 91 and a logic 0 value for the Control signal, transistors 78, 85 and 86 are nonconductive and transistor 77 is conductive. Therefore, the diodes 75 and 76 are no longer bypassed in one leg portion of the level shift circuit 40 and the diodes 83 and 84 are no longer bypassed in another leg portion of the level shift circuit 40. The current sources 80 and 87 are constant current sources and function to provide a sufficient current to enable or introduce a substantially constant voltage drop across diodes 75 and 76 and diodes 83 and 84, respectively. Under this circuit condition, the gate of transistor 82 is permitted to be lowered to a potential that is two diode drops above $V_{SS}$. This makes transistor 82 conductive which puts a voltage of approximately zero volts across the gate of transistor 74. Only one of transistor 82 or transistor 74 is conductive at any one point in time. Diodes 83 and 84 protect transistor 74 by limiting the $V_{GS}$ of transistor 74, including when the supply voltage is high enough to damage or destroy the gate oxide of transistor 74. Similarly, diodes 75 and 76 protect transistor 82 by limiting the $V_{GS}$ of transistor 82. The output of the level shift circuit 40 is connected to the tapered buffer circuit 44 for buffering before being used to drive the gate of pre-driver transistor 48. The tapering of drive strength from input to output provides a composite buffer that increases the drive (i.e. the voltage value) of the signal that is connected to the gate of transistor 48. When the voltage value present on the $V_{DD}$ voltage rail has exceeded the reference voltage value, diodes 105 and 106 function to effectively raise the voltage on internal node 29 to two diode voltage drops above $V_{SS}$. Therefore the voltage provided to the gate of pre-driver transistor 48 is reduced by this amount to permit a safe voltage to be applied to the gate of transistor 48. In both the mode of operation where the $V_{DD}$ voltage is below a designated maximum value and above that maximum value, the rail or conductor that is being used to power the circuitry functions as the output voltage terminal of the circuitry. Thus the output voltage is determining what the supply voltage is and will change as conditions in circuitry external to the driver circuitry changes.

When the Control signal changes to a logic 1 value, transistors 77, 78 and 86 are nonconductive and transistor 85 is conductive. In this circuit condition the node 94 is pulled to two diode voltage drops above $V_{SS}$ and transistor 74 is made conductive. In response, transistor 82 is biased with the $V_{DD}$ supply voltage rail and is nonconductive. Thus there has been provided circuitry within a driver circuit that uses comparison circuitry, level shifting and a rail voltage adjusting circuit to permit safe operation of transistors even when the supply voltage applied to a voltage rail exceeds a voltage that can damage the transistors.

Similar to the drive circuitry described above, level shift circuit 41 and tapered buffer circuit 45 provide a drive signal to the gate or control electrode of the N-channel pre-driver transistor 49. It is important that transistor 48 is turned off prior to transistor 49 turning on and vice-versa. Therefore, the combination of inverter 126 and delay circuit 118 and logic within control logic 56 are used to ensure that as one value of the Control signal transitions to the other value, there is enough propagation time to permit transistor 49 to turn off before transistor 48 can turn on and vice versa. This will prevent current being conducted through both of transistors 48 and 49 for power reasons. Level shift circuit 41 uses the rail voltage adjusting circuit 52 to reduce the value of the $V_{DD}$ supply voltage rail when $V_{DD}$ exceeds the reference voltage value. Similarly, the tapered buffer circuit 45 uses the rail voltage adjusting circuit 52 to selectively reduce the value of the $V_{DD}$ supply voltage rail.

Similar to the drive circuitry described above, the enable circuit 60, level shift circuit 42, and tapered buffer circuit 46 function analogously to enable circuit 58, level shift circuit 40 and tapered buffer circuit 44, respectively, in order to provide a drive signal to pre-driver transistor 50. The enable circuit 58, level shift circuit 40 and tapered buffer circuit 44 also use the comparison circuitry 68, control logic 56, rail voltage adjusting circuit 52 and rail voltage adjusting circuit 53. The level shift circuit 43 and tapered buffer circuit 47 function analogously to level shift circuit 41 and tapered buffer circuit 45, respectively, in order to provide a drive signal to pre-driver transistor 51. Pre-driver transistors 50 and 51 are connected to power transistor 16 for sequentially turning power transistor 16 on and off by respectively connecting the $V_{DD}$ supply voltage rail and the $V_{SS}$ voltage rail to the gate of power transistor 16. Power transistors 14 and 16 are turned on and off sequentially to connect the second terminal of inductor 20 to either the $V_{DD}$ supply rail or the $V_{SS}$ supply rail.

By now it should be appreciated that there has been provided circuitry in a driver circuit that allows the use of transistors in a voltage environment that exceeds the safe operating range of the gate-to-source voltage ($V_{GS}$) of the transistors. The circuit provides the use of transistors with a maximum gate-to-source voltage ($V_{GS}$) that does not affect the performance or functionality of other circuitry that the driver circuit may be used with.

There is herein provided in one form circuitry in a driver circuit having a driver circuit input and a driver circuit output. A first voltage rail provides the driver circuit output. The driver circuit output provides a supply voltage to the circuitry. There is provided a second voltage rail and a first pre-driver transistor having a control electrode, a first current electrode coupled to the first voltage rail, and a second current electrode. A power transistor has a control electrode coupled to the second current electrode of the first pre-driver transistor, a first current electrode coupled to the first voltage rail, and a second current electrode coupled to the driver circuit input. Comparison circuitry is coupled to the first voltage rail which indicates when a voltage level of the first voltage rail is above or below a reference voltage level. A level shift circuit is coupled between the first voltage rail and the second voltage rail which provides a level shifted output. A tapered buffer circuit is coupled to the first voltage rail and to a first circuit node, wherein the tapered buffer circuit receives the level shifted output and provides a buffered output to the control electrode of the first pre-driver transistor. A rail voltage adjusting circuit is coupled between the first circuit node and the second voltage rail, which, in response to the comparison circuitry indicating that the voltage level of the first voltage rail is above the reference voltage level, adjusts a voltage level of the second voltage rail. In another form the level shift circuit has a first transistor having a first current electrode coupled to the first voltage rail, a control electrode which provides the level shifted output, and a second current electrode. A leg portion is coupled between the second current electrode of the first transistor and the second voltage rail. An enable circuit is coupled to the leg portion, wherein, in response to the comparison circuitry indicating that the voltage level of the first voltage rail is above the reference voltage level, the enable circuit introduces a substantially constant voltage drop into the leg portion. In another form the enable circuit enables one or more diodes in series to introduce the substantially constant voltage drop. In yet another form the level shift circuit has a first transistor having a first current electrode coupled to the first voltage rail, a control electrode which provides the level shifted output, and a second current electrode. A second transistor has a first current electrode, a control electrode, and a second current electrode coupled to the second voltage rail. A third transistor has a first current electrode coupled to the second current electrode of the first transistor, a control electrode, and a second current electrode coupled to the second voltage rail. One or more diodes are coupled in series, wherein a cathode of the one or more diodes is coupled to the second current electrode of the first transistor and an anode of the one or more diodes is coupled the first current electrode of the second transistor. In another form there is provided an enable circuit having a first output coupled to the control electrode of the second transistor and a second output coupled to the control electrode of the third transistor. When the comparison circuitry indicates that the voltage level of the first voltage rail is above the reference voltage, the enable circuit asserts the first output to enable the second transistor and negates the second output to disable the third transistor. When the comparison circuitry indicates that the voltage level of the first voltage rail is below the reference voltage, the enable circuit asserts the first output to enable the third transistor and negates the second output to disable the second transistor. In another form there is provided a second pre-driver transistor having a control electrode, a first current electrode coupled to the control electrode of the power transistor, and a second current electrode coupled to the second voltage rail. A second level shift circuit is coupled between the second circuit node and the second voltage rail which provides a second level shifted output. A second tapered buffer circuit is coupled to the second voltage rail and a second circuit node. The second tapered buffer circuit receives the second level shifted output and provides a second buffered output to the control electrode of the second pre-driver transistor. A second rail voltage adjusting circuit is coupled between the first voltage rail and the second circuit node, which, in response to the comparison circuitry indicating that the voltage level of the first voltage rail is above the reference voltage level, adjusts a voltage level of the first voltage rail. In another form the second level shift circuit has a first transistor having a first current electrode coupled to the second circuit node, a control electrode coupled to provide the second level shifted output; and a second current electrode. A second transistor has a first current electrode coupled to the second current electrode of the first transistor, a control electrode, and a third current electrode coupled to the second rail voltage. In another form the rail voltage adjusting circuit has a transistor having a first current electrode coupled to the first circuit node, a second current electrode coupled to the second voltage rail, and a current electrode coupled to an output of the comparison circuitry. One or more diodes are coupled in series, wherein a cathode of the one or more diodes is coupled to the first circuit node and an anode of the one or more diodes is coupled to the second voltage rail.

In another form there is provided circuitry in a driver circuit having a driver circuit input and a driver circuit output. A first voltage rail provides the driver circuit output, the driver circuit output providing a supply voltage for the circuitry. There is also provided a second voltage rail. A first pre-driver transistor has a control electrode, a first current electrode coupled to the first voltage rail, and a second current electrode. A power transistor has a control electrode coupled to the second current electrode of the first pre-driver transistor, a first current electrode coupled to the first voltage rail, and a second current electrode coupled to the driver circuit input. Comparison circuitry has a first input coupled to the first voltage rail, a second input coupled to receive a reference voltage and an output which indicates when a voltage level of the first voltage rail is above or below the reference voltage. A level shift circuit is coupled between the first voltage rail and the second voltage rail. The level shift circuit has a first transistor having a first current electrode coupled to the first voltage rail, a control electrode coupled to the control electrode of the first pre-driver transistor, and a second current electrode. A second transistor has a first current electrode, a control electrode, and a second current electrode coupled to the second voltage rail. A third transistor has a first current electrode coupled to the second current electrode of the first transistor, a control electrode, and a second current electrode coupled to the second voltage rail. A circuit element provides a substantially constant voltage drop, the circuit element having a first terminal coupled to the second current electrode of the first transistor and a second terminal coupled to the first current electrode of the second transistor. When the output of the comparison circuit indicates that the voltage level of the first voltage rail is above the reference voltage, the second transistor is turned on and the third transistor is turned off. When the output of the comparison circuit indicates that the voltage level of the first voltage rail is below the reference voltage, the second transistor is turned off and the third transistor is turned on. A current source has a first terminal coupled to the first voltage rail and a second terminal coupled to the second current electrode of the first transistor. In another form the circuit element is one or more diodes in series, wherein a cathode of the one or more diodes is coupled to the second current electrode of the first transistor and an anode of the one or more diodes is coupled the first current electrode of the second transistor. In yet another form there is provided a tapered buffer circuit coupled between the control electrode of the first transistor and the control electrode of the first pre-driver transistor. In one form the tapered buffer circuit has a first power terminal coupled to the first voltage rail and a second power terminal coupled to a first circuit node. The driver circuit further has a rail voltage adjusting circuit coupled between the first circuit node and the second voltage rail, which, in response to the comparison circuitry indicating that the voltage level of the first voltage rail is above the reference voltage level, adjusts a voltage level of the second voltage rail. In another form the rail voltage adjusting circuit has a transistor having a first current electrode coupled to the first voltage rail, a second current electrode coupled to the first circuit node, and a current electrode coupled to the output of the comparison circuitry. The rail voltage adjusting circuit also has one or more diodes in series, wherein a cathode of the one or more diodes is coupled to the first voltage rail and an anode of the one or more diodes is coupled to the first circuit node.

In another form there is provided circuitry in a driver circuit having a driver circuit input and a driver circuit output. A first voltage rail provides the driver circuit output, the driver circuit output providing a supply voltage for the circuitry. There is also provided a second voltage rail. A first pre-driver transistor has a control electrode, a first current electrode coupled to the first voltage rail, and a second current electrode. A power transistor has a control electrode coupled to the second current electrode of the first pre-driver transistor, a first current electrode coupled to the first voltage rail, and a second current electrode coupled to the driver circuit input. A second pre-driver transistor has a control electrode, a first current electrode coupled to the control electrode of the power transistor, and a second current electrode coupled to the second voltage rail. Comparison circuitry is coupled to the first voltage rail and has an output which indicates when a voltage level of the first voltage rail is above or below a reference voltage level. A first level shift circuit is coupled between the first voltage rail and the second voltage rail which provides a level shifted output. A first tapered buffer circuit is coupled to the first voltage rail and to a first circuit node, wherein the tapered buffer circuit receives the level shifted output and provides a buffered output to the control electrode of the first pre-driver transistor. A first rail voltage adjusting circuit is coupled between the first circuit node and the second voltage rail, which, in response to the output of the comparison circuitry indicating that the voltage level of the first voltage rail is above the reference voltage level, introduces a substantially constant voltage drop between the first circuit node and the second voltage rail. A second level shift circuit is coupled between the second circuit node and the second voltage rail which provides a second level shifted output. A second tapered buffer circuit is coupled to the second voltage rail and a second circuit node. The second tapered buffer circuit receives the second level shifted output and provides a second buffered output to the control electrode of the second pre-driver transistor. A second rail voltage adjusting circuit is coupled between the first voltage rail and the second circuit node, which, in response to the output of the comparison circuitry indicating that the voltage level of the first voltage rail is above the reference voltage level, introduces a substantially constant voltage drop between the first voltage rail and the second circuit node. In another form the first level shift circuit has a first transistor having a first current electrode coupled to the first voltage rail, a control electrode which provides the level shifted output, and a second current electrode. A leg portion is coupled between the second current electrode of the first transistor and the second voltage rail. An enable circuit is coupled to the leg portion, wherein, in response to the comparison circuitry indicating that the voltage level of the first voltage rail is above the reference voltage level, the enable circuit introduces a substantially constant voltage drop into the leg portion. In another form the enable circuit enables one or more diodes in series to introduce the substantially constant voltage drop. In yet another form the first rail voltage adjusting circuit has a transistor having a first current electrode coupled to the first circuit node, a second current electrode coupled to the second voltage rail, and a current electrode coupled to the output of the comparison circuitry. The first rail voltage adjusting circuit also has one or more diodes in series, wherein a cathode of the one or more diodes is coupled to the first circuit node and an anode of the one or more diodes is coupled to the second voltage rail. In yet another form the second rail voltage adjusting circuit has a transistor having a first current electrode coupled to the first voltage rail, a second current electrode coupled to the second circuit node, and a current electrode coupled to the output of the comparison circuitry. The second rail voltage adjusting circuit has one or more diodes in series, wherein a cathode of the one or more diodes is coupled to the first voltage rail and an anode of the one or more diodes is coupled to the second circuit node.

Although the invention has been described with respect to specific conductivity types or polarity of potentials, skilled artisans appreciate that conductivity types and polarities of potentials may be reversed. In an alternative any of the embodiments described herein may be implemented by reversing the conductivities of each of the transistors from what is shown. The series-connected diodes may be implemented with a circuit element other than a diode provided the circuit element establishes a substantially constant voltage drop. It should further be understood that the load described herein may be implemented as either an active load or a passive load. For example, the load may be implemented either as an active load (transistors, thyristors, etc.) or as a passive load (resistive devices such as resistors, capacitive devices such as capacitors, etc.).

The term "coupled," as used herein, is not intended to be limited to a direct coupling or a mechanical coupling.

Although the invention is described herein with reference to specific embodiments, various modifications and changes can be made without departing from the scope of the present invention as set forth in the claims below. For example, various types of transistors may be implemented, such as MOS (metal oxide semiconductor), bipolar, GaAs, silicon on insulator (SOI) and others. The amount of power supply voltage reduction can be adjusted according to specific application requirements. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. Circuitry in a driver circuit having a driver circuit input and a driver circuit output, comprising:
   a first voltage rail which provides the driver circuit output, the driver circuit output providing a supply voltage to the circuitry;
   a second voltage rail;
   a first pre-driver transistor having a control electrode, a first current electrode coupled to the first voltage rail, and a second current electrode;
   a power transistor having a control electrode coupled to the second current electrode of the first pre-driver transistor, a first current electrode coupled to the first voltage rail, and a second current electrode coupled to the driver circuit input;
   comparison circuitry coupled to the first voltage rail which indicates when a voltage level of the first voltage rail is above or below a reference voltage level;
   a level shift circuit coupled between the first voltage rail and the second voltage rail which provides a level shifted output;
   a tapered buffer circuit coupled to the first voltage rail and to a first circuit node, wherein the tapered buffer circuit receives the level shifted output and provides a buffered output to the control electrode of the first pre-driver transistor; and
   a rail voltage adjusting circuit coupled between the first circuit node and the second voltage rail, which, in response to the comparison circuitry indicating that the voltage level of the first voltage rail is above the reference voltage level, adjusts a voltage level of the second voltage rail.

2. The driver circuit of claim 1, wherein the level shift circuit comprises:
   a first transistor having a first current electrode coupled to the first voltage rail, a control electrode which provides the level shifted output, and a second current electrode;

a leg portion coupled between the second current electrode of the first transistor and the second voltage rail; and an enable circuit coupled to the leg portion, wherein, in response to the comparison circuitry indicating that the voltage level of the first voltage rail is above the reference voltage level, the enable circuit introduces a substantially constant voltage drop into the leg portion.

3. The driver circuit of claim 2, wherein the enable circuit enables one or more diodes in series to introduce the substantially constant voltage drop.

4. The driver circuit of claim 1, wherein the level shift circuit comprises:

a first transistor having a first current electrode coupled to the first voltage rail, a control electrode which provides the level shifted output, and a second current electrode;

a second transistor having a first current electrode, a control electrode, and a second current electrode coupled to the second voltage rail;

a third transistor having a first current electrode coupled to the second current electrode of the first transistor, a control electrode, and a second current electrode coupled to the second voltage rail; and one or more diodes in series, wherein a cathode of the one or more diodes is coupled to the second current electrode of the first transistor and an anode of the one or more diodes is coupled the first current electrode of the second transistor.

5. The driver circuit of claim 4, further comprising:

an enable circuit having a first output coupled to the control electrode of the second transistor and a second output coupled to the control electrode of the third transistor, wherein:

when the comparison circuitry indicates that the voltage level of the first voltage rail is above the reference voltage level, the enable circuit asserts the first output to enable the second transistor and negates the second output to disable the third transistor, and when the comparison circuitry indicates that the voltage level of the first voltage rail is below the reference voltage level, the enable circuit asserts the first output to enable the third transistor and negates the second output to disable the second transistor.

6. The driver circuit of claim 1, further comprising:

a second pre-driver transistor having a control electrode, a first current electrode coupled to the control electrode of the power transistor, and a second current electrode coupled to the second voltage rail;

a second level shift circuit coupled between a second circuit node and the second voltage rail which provides a second level shifted output;

a second tapered buffer circuit coupled to the second voltage rail and the second circuit node, the second tapered buffer circuit receives the second level shifted output and provides a second buffered output to the control electrode of the second pre-driver transistor; and a second rail voltage adjusting circuit coupled between the first voltage rail and the second circuit node, which, in response to the comparison circuitry indicating that the voltage level of the first voltage rail is above the reference voltage level, adjusts a voltage level of the first voltage rail.

7. The driver circuit of claim 6, wherein the second level shift circuit comprises:

a first transistor having a first current electrode coupled to the second circuit node, a control electrode coupled to provide the second level shifted output; and a second current electrode; and a second transistor having a first current electrode coupled to the second current electrode of the first transistor, a control electrode, and a third current electrode coupled to the second rail voltage.

8. The driver circuit of claim 1, wherein the rail voltage adjusting circuit comprises:

a transistor having a first current electrode coupled to the first circuit node, a second current electrode coupled to the second voltage rail, and a current electrode coupled to an output of the comparison circuitry; and one or more diodes in series, wherein a cathode of the one or more diodes is coupled to the first circuit node and an anode of the one or more diodes is coupled to the second voltage rail.

9. Circuitry in a driver circuit having a driver circuit input and a driver circuit output, comprising:

a first voltage rail which provides the driver circuit output, the driver circuit output providing a supply voltage for the circuitry;

a second voltage rail;

a first pre-driver transistor having a control electrode, a first current electrode coupled to the first voltage rail, and a second current electrode;

a power transistor having a control electrode coupled to the second current electrode of the first pre-driver transistor, a first current electrode coupled to the first voltage rail, and a second current electrode coupled to the driver circuit input;

comparison circuitry having a first input coupled to the first voltage rail, a second input coupled to receive a reference voltage and an output which indicates when a voltage level of the first voltage rail is above or below the reference voltage; and a level shift circuit coupled between the first voltage rail and the second voltage rail, the level shift circuit comprising:

a first transistor having a first current electrode coupled to the first voltage rail, a control electrode coupled to the control electrode of the first pre-driver transistor, and a second current electrode;

a second transistor having a first current electrode, a control electrode, and a second current electrode coupled to the second voltage rail;

a third transistor having a first current electrode coupled to the second current electrode of the first transistor, a control electrode, and a second current electrode coupled to the second voltage rail; and a circuit element which provides a substantially constant voltage drop, the circuit element having a first terminal coupled to the second current electrode of the first transistor and a second terminal coupled to the first current electrode of the second transistor.

10. The driver circuit of claim 9, wherein:

when the output of the comparison circuitry indicates that the voltage level of the first voltage rail is above the reference voltage, the second transistor is turned on and the third transistor is turned off, and when the output of the comparison circuitry indicates that the voltage level of the first voltage rail is below the reference voltage, the second transistor is turned off and the third transistor is turned on.

11. The driver circuit of claim 9, further comprising:

a current source having a first terminal coupled to the first voltage rail and a second terminal coupled to the second current electrode of the first transistor.

12. The driver circuit of claim 9, wherein the circuit element comprises:
one or more diodes in series, wherein a cathode of the one or more diodes is coupled to the second current electrode of the first transistor and an anode of the one or more diodes is coupled the first current electrode of the second transistor.

13. The driver circuit of claim 9, further comprising:
a tapered buffer circuit coupled between the control electrode of the first transistor and the control electrode of the first pre-driver transistor.

14. The driver circuit of claim 13, wherein the tapered buffer circuit has a first power terminal coupled to the first voltage rail and a second power terminal coupled to a first circuit node, the driver circuit further comprising:
a rail voltage adjusting circuit coupled between the first circuit node and the second voltage rail, which, in response to the comparison circuitry indicating that the voltage level of the first voltage rail is above the reference voltage, adjusts a voltage level of the second voltage rail.

15. The driver circuit of claim 14, wherein the rail voltage adjusting circuit comprises:
a transistor having a first current electrode coupled to the first voltage rail, a second current electrode coupled to the first circuit node, and a current electrode coupled to the output of the comparison circuitry; and
one or more diodes in series, wherein a cathode of the one or more diodes is coupled to the first voltage rail and an anode of the one or more diodes is coupled to the first circuit node.

16. Circuitry in a driver circuit having a driver circuit input and a driver circuit output, comprising:
a first voltage rail which provides the driver circuit output, the driver circuit output providing a supply voltage for the circuitry;
a second voltage rail;
a first pre-driver transistor having a control electrode, a first current electrode coupled to the first voltage rail, and a second current electrode;
a power transistor having a control electrode coupled to the second current electrode of the first pre-driver transistor, a first current electrode coupled to the first voltage rail, and a second current electrode coupled to the driver circuit input;
a second pre-driver transistor having a control electrode, a first current electrode coupled to the control electrode of the power transistor, and a second current electrode coupled to the second voltage rail;
comparison circuitry coupled to the first voltage rail and having an output which indicates when a voltage level of the first voltage rail is above or below a reference voltage level;
a first level shift circuit coupled between the first voltage rail and the second voltage rail which provides a level shifted output;
a first tapered buffer circuit coupled to the first voltage rail and to a first circuit node, wherein the first tapered buffer circuit receives the level shifted output and provides a buffered output to the control electrode of the first pre-driver transistor;
a first rail voltage adjusting circuit coupled between the first circuit node and the second voltage rail, which, in response to the output of the comparison circuitry indicating that the voltage level of the first voltage rail is above the reference voltage level, introduces a substantially constant voltage drop between the first circuit node and the first circuit node;
a second level shift circuit coupled between a second circuit node and the second voltage rail which provides a second level shifted output;
a second tapered buffer circuit coupled to the second voltage rail and the second circuit node, the second tapered buffer circuit receives the second level shifted output and provides a second buffered output to the control electrode of the second pre-driver transistor; and
a second rail voltage adjusting circuit coupled between the first voltage rail and the second circuit node, which, in response to the output of the comparison circuitry indicating that the voltage level of the first voltage rail is above the reference voltage level, introduces a substantially constant voltage drop between the first voltage rail and the second circuit node.

17. The driver circuit of claim 16, wherein the first level shift circuit comprises:
a first transistor having a first current electrode coupled to the first voltage rail, a control electrode which provides the level shifted output, and a second current electrode;
a leg portion coupled between the second current electrode of the first transistor and the second voltage rail; and
an enable circuit coupled to the leg portion, wherein, in response to the comparison circuitry indicating that the voltage level of the first voltage rail is above the reference voltage level, the enable circuit introduces a substantially constant voltage drop into the leg portion.

18. The driver circuit of claim 17, wherein the enable circuit enables one or more diodes in series to introduce the substantially constant voltage drop.

19. The driver circuit of claim 16, wherein the first rail voltage adjusting circuit comprises:
a transistor having a first current electrode coupled to the first circuit node, a second current electrode coupled to the second voltage rail, and a current electrode coupled to the output of the comparison circuitry; and
one or more diodes in series, wherein a cathode of the one or more diodes is coupled to the first circuit node and an anode of the one or more diodes is coupled to the second voltage rail.

20. The driver circuit of claim 16, wherein the second rail voltage adjusting circuit comprises:
a transistor having a first current electrode coupled to the first voltage rail, a second current electrode coupled to the second circuit node, and a current electrode coupled to the output of the comparison circuitry; and
one or more diodes in series, wherein a cathode of the one or more diodes is coupled to the first voltage rail and an anode of the one or more diodes is coupled to the second circuit node.

* * * * *